US012669371B2

(12) United States Patent
Muralt et al.

(10) Patent No.: US 12,669,371 B2
(45) Date of Patent: Jun. 30, 2026

(54) FLEXIBLE, PIEZOELECTRIC, MINIATURIZED VIBRATION SENSOR FOR MACHINE INTEGRATION

(71) Applicant: PIEMACS SÀRL, Lausanne (CH)

(72) Inventors: Paul Muralt, La Sarraz (CH); Ramin Matloub, Renens (CH); Robin Nigon, Lausanne (CH)

(73) Assignee: PIEMACS SÀRL, Lausanne (CH)

( * ) Notice: Subject to any disclaimer, the term of this patent is extended or adjusted under 35 U.S.C. 154(b) by 289 days.

(21) Appl. No.: 18/548,476

(22) PCT Filed: Mar. 4, 2022

(86) PCT No.: PCT/IB2022/051930
§ 371 (c)(1),
(2) Date: Aug. 30, 2023

(87) PCT Pub. No.: WO2022/185272
PCT Pub. Date: Sep. 9, 2022

(65) Prior Publication Data
US 2024/0159583 A1     May 16, 2024

(51) Int. Cl.
*G01H 11/08*     (2006.01)
*H10N 30/30*     (2023.01)
*H10N 30/88*     (2023.01)

(52) U.S. Cl.
CPC ........... *G01H 11/08* (2013.01); *H10N 30/302* (2023.02); *H10N 30/883* (2023.02)

(58) Field of Classification Search
CPC .... G01H 11/08; H10N 30/302; H10N 30/304; H10N 30/306; G01L 1/16; G01P 15/09;
(Continued)

(56) References Cited

U.S. PATENT DOCUMENTS 4,853,810 A     8/1989  Pohl et al.
5,997,686 A    12/1999  Lardon et al.
(Continued)

FOREIGN PATENT DOCUMENTS

EP     2901200 B1    11/2016
EP     3534130 A1     9/2019
(Continued)

OTHER PUBLICATIONS

Moulet, J-S., et al. "High piezoelectric properties in LiNbO 3 transferred layer by the Smart Cut™ technology for ultra wide band BAW filter applications." 2008 IEEE International Electron Devices Meeting. IEEE, 2008.*
(Continued)

*Primary Examiner* — Herbert K Roberts
(74) *Attorney, Agent, or Firm* — NIXON & VANDERHYE

(57)     ABSTRACT

A vibration sensor based on piezoelectric thin films, or smart cuts of piezoelectric materials, integrated into a functional, metallic housing that transmits vibration deformations applied to the housing correctly into the sensor in a frequency range that is typically—but not limited to—1 Hz to 20 kHz. The sensor comprises a low-stiffness layer, for instance a PCB layer, providing a controllable contact force between sensor structure machine parts, and transforming the relative movements into a mechanical stress acting onto the piezoelectric layer.

19 Claims, 6 Drawing Sheets

(58) Field of Classification Search

CPC ............. G01P 15/0907; G01P 15/0915; G01P 15/0922

See application file for complete search history.

(56) References Cited

U.S. PATENT DOCUMENTS

| | | | |
|---|---|---|---|
| 6,533,534 | B2 | 3/2003 | Schmitt et al. |
| 8,829,766 | B2 | 9/2014 | Milyutin et al. |
| 10,079,334 | B2 | 9/2018 | Moulard et al. |
| 10,097,152 | B2 | 10/2018 | Moulard et al. |
| 10,206,045 | B2 | 2/2019 | Kaltenbacher et al. |
| 2002/0195917 | A1 | 12/2002 | Hiramatsu |
| 2005/0057123 | A1* | 3/2005 | Deng .................... H02N 2/186 |
| | | | 310/339 |
| 2006/0125746 | A1 | 6/2006 | Sallese et al. |
| 2008/0311434 | A1 | 12/2008 | Rey-mermet et al. |
| 2011/0023592 | A1* | 2/2011 | Hortig ................ B60C 23/0411 |
| | | | 73/146.5 |
| 2011/0296918 | A1* | 12/2011 | Yao ..................... G01P 15/0802 |
| | | | 216/13 |
| 2015/0221855 | A1 | 8/2015 | Vaeth et al. |
| 2015/0226618 | A1 | 8/2015 | Shih |
| 2016/0097696 | A1* | 4/2016 | Zusman .................. F16L 55/28 |
| | | | 29/25.35 |
| 2016/0129332 | A1 | 5/2016 | Davenport |
| 2017/0343410 | A1 | 11/2017 | Pretorius |
| 2018/0058954 | A1 | 3/2018 | Kihara et al. |
| 2018/0172472 | A1* | 6/2018 | Grant .................. H10N 30/302 |
| 2019/0151711 | A1 | 5/2019 | Davenport |
| 2019/0250056 | A1* | 8/2019 | Iwabuchi ................ G01L 23/10 |
| 2021/0025767 | A1 | 1/2021 | Cha et al. |
| 2021/0041287 | A1 | 2/2021 | Rimminen et al. |
| 2021/0199687 | A1* | 7/2021 | Navacchia ............. H10N 30/01 |
| 2021/0320317 | A1 | 10/2021 | Hadad et al. |
| 2022/0163378 | A1* | 5/2022 | Masuda ................. G01H 11/08 |

FOREIGN PATENT DOCUMENTS

| | | |
|---|---|---|
| JP | H05-172624 A | 7/1993 |
| JP | 2003077620 A | 3/2003 |
| JP | 2005191723 A | 7/2005 |
| JP | 2018072057 A | 5/2018 |
| KR | 2011-0133965 A | 12/2011 |
| WO | 2016/202948 A1 | 12/2016 |
| WO | 2016194690 A1 | 12/2016 |
| WO | 2017045700 A1 | 3/2017 |
| WO | 2017183708 A1 | 10/2017 |
| WO | 2019/150850 A1 | 8/2019 |
| WO | 2019/192811 A2 | 10/2019 |
| WO | 2019/195264 A1 | 10/2019 |
| WO | 2020/074075 A1 | 4/2020 |
| WO | 2020/255920 A1 | 12/2020 |
| WO | 2021/174316 A1 | 9/2021 |

OTHER PUBLICATIONS

Akiyama, Morito, et al., "Enhancement of Piezoelectric Response in Scandium Aluminum Nitride Alloy Thin Films Prepared by Dual Reactive Cosputtering," Advanced Materials, vol. 21, 2009, pp. 593-596.

Baborowski, J., et al., "Fabrication and Characterization of Micromachined Accelerometers Based on PZT Thin Films," Ferroelectrics, vol. 224, 1999, pp. 283-290.

Barzegar, A., et al., "Piezoelectric response of thin films determined by charge integration technique: Substrate bending effects," Journal of Applied Physics, vol. 93, No. 8, Apr. 15, 2003, pp. 4756-4760.

Beex, L. A. A., "Warpage of Printed Circuit Boards," Bachelor Final Project, Eindhoven University of Technology, May 18, 2005, 27 pages.

Dubois, Marc-Alexandre, et al., "Measurement of the effective transverse piezoelectric coefficient e31,f of AlN and Pb (Zrx, Ti1-x)O3 thin films," Sensors and Actuators, vol. 77, 1999, pp. 106-112.

Dubois, Marc-Alexandre, et al., "Properties of aluminum nitride thin films for piezoelectric transducers and microwave filter applications," Applied Physics Letters, vol. 74, No. 20, May 17, 1999, pp. 3032-3034.

Meng, Qingyuan, et al., "Modeling of the electromechanical performance of piezoelectric laminated microactuators," Journal of Micromechanics and Microengineering, vol. 3, 1993, pp. 18-23.

Mertin, Stefan, et al., "Enhanced piezoelectric properties of c-axis textured aluminium scandium nitride thin films with high scandium content: influence of intrinsic stress and sputtering parameters," 2017 IEEE International Ultrasonics Symposium (IUS), vol. 978-1-5386-3383-0/17, 2017, 4 pages.

Mertin, Stefan, et al., "Piezoelectric and structural properties of c-axis textured aluminium scandium nitride thin films up to high scandium content," Surface & Coatings Technology, vol. 343, 2018, pp. 2-6.

Meyer, Y., et al., "Active isolation of electronic micro-components with piezoelectrically transduced silicon MEMS devices," Smart Materials and Structures, vol. 16, 2007, pp. 128-134.

Moulet, J.-S., et al., "High piezoelectric properties in LiNbO3 transferred layer by the Smart Cut™ technology for ultra wide band BAW filter applications," 2008 IEEE International Electron Devices Meeting (IEDM), 2008, 4 pages.

Muralt, P., "Ferroelectric thin films for micro-sensors and actuators: a review," Journal of Micromechanics and Microengineering, vol. 10, 2000, pp. 136-146.

Muralt, Paul, "Piezoelectric Thin Films for MEMS," Integrated Ferroelectrics, vol. 17, 1997, pp. 297-307.

Nemirovsky, Y., et al., "Design of a novel thin-film piezoelectric accelerometer," Sensors and Actuators A, vol. 56, 1996, pp. 239-249.

Polla, D. L., "Integrated Ferroelectric Microelectromechanical Systems," Science and Technology of Electroceramic Thin Films, 1995, pp. 413-426.

Smits, Jan G., et al., "The Constituent Equations of Piezoelectric Heterogeneous Bimorphs," IEEE Transactions on Ultrasonics, Ferroelectrics, and Frequency Control, vol. 38, No. 3, May 1991, pp. 256-270.

Waanders, J. W., "Piezoelectric Ceramics: Properties and Applications," Philips Components, 1991, 94 pages.

Wang, Zhixin, et al., "Crosslinking Effect on Polydimethylsiloxane Elastic Modulus Measured by Custom-Built Compression Instrument," Journal of Applied Polymer Science, vol. 131, Issue 22, 2014, p. 41050.

M Sinusía Lozano et al., "Temperature characteristics of SAW resonators on Sc0.26A10.74N/polycrystalline diamond heterostructures", Smart Materials and Structures, vol. 27, No. 7, May 31, 2018, 8 pages, IOP Publishing LTD.

International Search Report for PCT/IB2022/051930 mailed Jul. 14, 2022, 5 pages.

Written Opinion of the ISA for PCT/IB2022/051930 mailed Jul. 14, 2022, 6 pages.

Office Action, issued in Japanese Patent Application No. 2023-553187 dated Mar. 10, 2026.

* cited by examiner

Actuators                              Sensors

FLEXIBLE, PIEZOELECTRIC, MINIATURIZED VIBRATION SENSOR FOR MACHINE INTEGRATION

Corresponding application

This application is the U.S. national phase of International Application No. PCT/IB2022/051930 filed Mar. 4, 2022, which designated the U.S. and claims priority to the earlier PCT patent application N°PCT/IB2021/051821 filed on Mar. 4, 2021, in the name of PIEMACS Sàrl, the entire contents of each of which are hereby incorporated by reference.

Field of the Invention and Principle

Vibration detection is an important sensor application for controlling the integrity of machines and airplanes, and for checking the correct working environment for sensitive measurement tools, and furthermore. It is also more and more used in order to detect in an early stage a typical vibration that is known as precursor of a given failure. The present invention and its embodiments propose among others a novel method with which the vibration displacements of machine pieces are directly used as input variables, thus without the use of seismic masses as in accelerometers. For this purpose, miniaturized sensors based on piezoelectric thin films or smart cuts of piezoelectric crystals are layered with metal sheets and are integrated into specific, functional housings, which can be mounted between neighboring machine parts exhibiting vibrations against each other. The goal is a vibration sensor that can be easily integrated into machines or machine parts, offering an adaptive housing, with a total volume of less than one cubic centimeter.

Introduction—Prior Art

Vibration sensors are an important category of sensors. They detect vibrations of engines, airplanes, buildings, bridges, motors, and furthermore. The goal is for instance to detect unusual levels of vibrations in order to prevent a failure, or to detect a failure. In case of measurement set-ups that are vibration sensitive (such as atomic force microscopes), vibration sensors provide environmental data for optimizing placement, and damping devices in order to assure optimal performance. They might also be part of an experimental set-up, such as a crash test for cars, and provide the peak acceleration of the mechanical shock. Vibration sensors are also closely related, if not identical, to accelerometers, dynamic force sensors, and vibration energy harvesting devices. The differences are precision and accuracy (calibration) of the output data (mostly acceleration), and of the electronics that must provide different functions, such as charge or voltage amplification, energy capture and storage. The frequencies of the vibrations of interest range from a few Hz to about 20 kHz.

Piezoelectric materials play an important role in vibration sensors. The reasons are:

Efficient transformation from mechanical and motional quantities (strain or stress changes) to electrical signals Good signal-to-noise ratios Work in a wide frequency range—depending on dimensions and seismic masses Very local detection Cost effective Larger devices are realized with piezoelectric bulk materials such as quartz, PZT (Pb(Zr, Ti)$O_3$ ceramics, or related ceramics either with lead (Pb) or without (see, e.g., reference [1]).

In the present invention we shall deal exclusively with piezoelectric materials in the form of thin films. Piezoelectric thin films are mostly integrated into silicon devices for the fabrication of so-called Micro-Electro-Mechanical Systems (MEMS), see reference [2]. The first thin film force sensor is maybe mentioned in a conference paper by D. L. Polla, see reference [3]. The first MEMS accelerometer was probably published in 1999 and presented in 1998 at the ECAPD-ISAF-Electroceramics conference 1998, see reference [4].

FIG. 1 illustrates a Micromachined accelerometer having a PZT thin film on a silicon cantilever (a) View of the backside showing the thinned silicon beam and the seismic mass of silicon. (b) Schematic top view and cross section (from ref. [4]).

FIG. 2 illustrates a schematic drawing and parameter definition for a piezoelectric heteromorph consisting of an elastic, passive layer on which a piezoelectric stack consisting of bottom electrode, piezoelectric layer, and top electrode is deposited (from reference [5]). The basic MEMS structure for piezoelectric sensing is shown in FIG. 2. It is a flexural, elastic bender in which the piezoelectric film with electrodes is integrated. If the internal polarization is vertical to the film plane (directing from top to bottom electrode or vice-versa) the longitudinal piezoelectric effect acts along the thickness (direction 3), and the transverse effect with the plane (directions 1 and 2). The piezoelectric thin film has different boundary conditions as compared to a free piezoelectric body. The film must follow the strain change ($x_1$ in FIG. 2) in the plane with the substrate (passive material), but is free perpendicular to the film plane, except if a force is imposed to the layer stack perpendicular to the plane (stress $\sigma_3$). This situation of mixed boundary conditions ($S_1=S_2=0$; $\sigma_3=0$)) leads to modified piezoelectric coefficients (see reference [5]), and the collected charge density $D_3$ can then be written as:

$$D_3 = \varepsilon_o\varepsilon_{33,f} \cdot E_3 + e_{31,f} \cdot (x_1 + x_2) + d_{33,f} \cdot \sigma_3 \tag{1}$$

where:

$$e_{31,f} = \frac{d_{31}}{s_{11}^E + s_{12}^E} = e_{31} - \frac{c_{13}^E}{c_{33}^E}e_{33} \quad d_{33,f} = \frac{e_{33}}{c_{33}^E} = d_{33} - \frac{2s_{13}^E}{s_{11}^E + s_{12}^E}d_{31} \tag{2}$$

$$\varepsilon_{33,f} = \varepsilon_{33}^\sigma - \frac{2d_{31}^2}{\varepsilon_0(s_{11}^E + s_{12}^E)}$$

Until now, most of the structures proposed for vibration sensors were based on the transverse effect occurring in a piezoelectric laminated elastic beam, and mostly applied in combination with a seismic mass (M) serving to enhance the vibration amplitude at the resonance frequency defined by the spring to mass ratio, as shown in FIG. 1. The free beam structure has the role of the spring.

The eigenfrequency $f_0$ can be tuned by the mass M, the length (L) and width (w) of the free part of the cantilever, the thickness (t) of the total cantilever, and an effective elastic modulus Y of the laminate.

$$f_0 = \frac{1}{2\pi}\sqrt{\frac{Ywt^3}{4ML^3}} \tag{3}$$

In order to derive the charge response of the cantilever (beam), following the second term of equation 1, one has to evaluate the strain in the piezoelectric layer, which is laminated to a thicker elastic layer. This is treated for instance in refs [6] and [7]. Additional parameters are playing a role: the thickness ratio of piezoelectric layer and passive elastic layer, and elastic properties of the involved materials. In such free bending structures, the stress $\sigma_3$ is always zero. To a first approximation, the in-plane strain $x_1$ in the piezoelectric thin film is inversely proportional to the bending radius R, and proportional to the distance $h_{pn}$ between the center of piezoelectric film and the neutral plane in the bent cantilever (plane that is not strained). In the simplest case, the thickness $t_p$ of the piezoelectric film is much smaller than the one of the passives, elastic layer ($t_e$), and $h_{pn} \approx t_2/2$. In this case, the charge generated density is simply:

$$D_3 \sim e_{31,f} \frac{t_e}{2R} \tag{4}$$

Depending on the width to thickness ratio of the cantilever, one has also to include a correction due to Poisson ratio $v$ of the elastic layer material ($x_2$ is not zero, but $-vx_1$) for not too large width to thickness ratios. As in this case also $t \approx t_e$ holds, it is clear that increasing the thickness for a larger response leads as well to a higher resonance frequency. For sensors and energy harvesting, a typical thickness ratio is $t_p = t_e/10$.

One way of coupling vibrations into a cantilever consists in having the cantilever as "bridge" between the two pieces that vibrate against each other. This is rarely realized, and novel for vibration sensors that are sold as all-purpose sensors. The reason is that the geometry of the sensor must be adapted to the concrete situation. Following this idea, the cantilever can be clamped on one side ($1^{st}$ piece) and deflected at the other end in the direction perpendicular to the cantilever plane by the second piece. The thickness of the cantilever can be chosen thicker to increase the response as long as the forces from the vibrating pieces are larger than the opposing forces by the sensor rigidity. This will also give a high resonance frequency that is above the resonances occurring in the system to be measured. One can thus work with the case of $t_p \ll t_e$. This problem was treated for a set-up measuring $e_{31,f}$ in a bending experiment while performing a defined excursion at the end of a clamped cantilever, see reference [8]. It is assumed that the cantilever is clamped till $\ell = 0$, the electrode ranges from 0 to $\ell_1$, and the excursion is applied at $\ell = L$ ($> \ell_1$) (see FIG. 3):

$$Q = \frac{3wt_e Z_L(1-v)\ell_1\left(L - \frac{\ell_1}{2}\right)e_{31,f}}{2L^3} = \frac{3At_e(1-v)\left(L - \frac{\ell_1}{2}\right)e_{31,f}}{2L^3}Z_L \tag{5}$$

A is the electrode area $w\ell_1$. The sign of the charge depends of course on the polar direction (polarization) of the film, and on the sign on the externally applied excursion.

FIG. 3 illustrates the Bending of a cantilever by an excursion $Z_L$ at the end L. A is the electrode area. More is explained in the text.

The use of the longitudinal effect, and thus operating with a non-zero $\sigma_3$, is rarely studied with thin films. Their structure is much stiffer, eigenfrequencies are much higher. With elastic matching layers between a seismic mass and the piezoelectric stack, and low-noise amplifiers it is, however, possible to achieve a good sensor performance. Nemirowsky et al. calculated a sensitivity of 32 mV/g and a noise-equivalent acceleration of 0.008 g with a PZT thin film structure, see reference [9]. Note that in this article, the seismic mass is directly acting onto the piezoelectric layer. The polymer serves only to fill the voids between the piezoelectric elements obtained by removing the piezoelectric film between these elements. This area reduction serves to increasing the stress per active area and reducing the total capacitance. Both measures increase the voltage response. The filling of the voids by a polymer is effectuated for allowing the deposition of a flat electrode on top of the piezoelectric element array. The polymer has a negligible mechanical effect.

FIG. 4 illustrates an Accelerometer employing the longitudinal piezoelectric effect of a PZT thin film poled with the electrodes of the device, i.e., perpendicular to the film plane (from reference [9]).

This principle was also proposed for an active damping device, in which the longitudinal effect was sensing the acceleration by means of a seismic mass directly attached to the top electrode of the piezoelectric element.

FIG. 5 illustrates Longitudinal effect exploited in accelerometer with seismic mass combined with active damping in a microdevice, see reference [10].

In the present invention, there is a need for a compressible layer in the sensor stack for guaranteeing that the sensor stack fills the complete space between the two machine parts, and to account for machining tolerances impacting on distance and parallelism between the relevant surfaces of the two machine parts.

SUMMARY OF THE INVENTION

There are 2 types of working principles with thin film vibration sensors of prior art:

| Type | Basic structure | Piezoelectric effect | Deformation type | Coupling | Resonant method |
|---|---|---|---|---|---|
| 1 | Cantilever | Transverse | Bending | To acceleration by seismic mass | Yes |
| 2 | Sandwich on plate | Longitudinal | Alternate compression and decompression | To acceleration by seismic mass | Yes |

Proposed novel types for adaptive integration into machines, motors, etc. according to embodiments of the present invention

| Type | Basic structure | Piezoelectric effect | Deformation type | Coupling | Resonant method |
|---|---|---|---|---|---|
| 1 | Cantilever | Transverse | Bending | To deformation by deflection | No |
| 2 | Sandwich on plate | Longitudinal | Strain transmitted as vibration amplitude difference of adjacent pieces | Strain-Stress transformation through softer matching/transformation layer | No |

Motivation for Novel Concepts and Realizations—Technical Problems

Materials: Most of the time, the applied MEMS technology employed PZT thin films in silicon technology. We are seeking to conceive a version that is able to be used in modern motors and other devices that cause vibration when they malfunction, or risk to malfunction when subject to vibrations. The devices must be robust in order to survive shocks. For this reason, monocrystalline silicon is not a suitable material. It is better to use metals, which are tougher and still very elastic. In addition, PZT is a material containing lead. It should preferentially be substituted by a lead-free material.

General design principle: The device should be easy to integrate into machine parts. The device should be miniature enough and comprising an adaptable design to be integrated between machine parts. It should not be a "stand-alone" device that is hooked onto a corner of the motor housing, for instance.

Electronics: As we deal with a rather high-impedance effect (the piezoelectric device is basically a capacitor), the vibration sensor is prone to pick-up signals from the electromagnetic environment and thus must be well shielded in an encapsulation serving as Faraday cage.

There are thus several issues to be solved:

Parts giving mechanical stability must preferably be made of a metal, for instance in the form of a metal sheet Preferably lead free materials Preferably miniature format Preferably integrated into machine part Encapsulation preferably providing electromagnetic shielding

Embodiments of the present invention

Features and embodiments of the invention are in particular the following:

1. New type of sensor: longitudinal effect in piezoelectric film embedded in a layer stack on a metal plate picking up the deformation in the perpendicular direction of the plate. Has no seismic mass.
2. Piezoelectric thin film on metal sheet as basic structure for the sensor
3. Suitable encapsulation
4. Signal read out with local JFET transistor
5. Segmented electrodes for identifying different vibration modes (phase or amplitude differences)

As one will understand from the present disclosure, the present invention encompasses many features and embodiments.

In an embodiment, the present invention concerns a vibration sensor based on piezoelectric thin films, or smart cuts of piezoelectric materials. The sensor may comprise a layered composite comprising at least one substrate layer and at least one piezoelectric layer. The piezoelectric layer may comprise a piezoelectric thin film or at least one smart cuts of piezoelectric materials and an electrode structure. The vibration sensor may be integrated into a functional, metallic housing that transmits vibration deformations applied to the housing correctly into the sensor in a frequency range. The sensor may further perform a mechanical to electrical conversion through the various piezoelectric coefficients of the layered material coupling to thickness changes or lateral strain changes or shear strain changes.

In embodiments, the housing and the connecting wires may be optimized for shielding against parasitic electromagnetic signals.

In embodiments, the frequency range may be 10 Hz to 20 kHz.

In embodiments, the frequency range may be 100 Hz to 20 kHz.

In embodiments, the sensor may be either based on
  a. The longitudinal piezoelectric effect along the thickness of the piezoelectric layer wherein the deformation of the housing is transformed to a stress by a suitable polymer layer and the charges or the voltage is gathered at parallel electrodes, one on upper side of the piezoelectric layer, one at the bottom side of the latter; or
  b. The shear piezoelectric effect obtained when the upper surface of the housing is moving against the lower surface of the housing, wherein in this case, the piezoelectric layer is preferably on an insulating substrate, and the electrodes are only on one side in form of interdigitated electrodes; or
  c. The housing is made in such a way as to receive a first vibration amplitude from one machine piece at site 1, and a second vibration amplitude from a second machine piece at site 2, wherein the sensor is in the form of a beam connecting the two sites and being deformed when the 2 sites move against each other and wherein the piezoelectric layer is attached to the beam and generates charges and voltage between parallel top and bottom electrodes according to the transverse piezoelectric effect.

In embodiments, the longitudinal and transverse piezoelectric effect may be exploited simultaneously in the same device, the transverse sensor working either as described in point 5c or having a seismic mass to transform acceleration into a bending motion of a cantilever laminated with a piezoelectric layer (film).

In embodiments, the sensor may be based on a piezoelectric layer bonded or deposited onto a metallic, robust metal sheet with a thickness of typically—but not limited to—10 to 500 μm.

In embodiments, the metal sheet may be typically, but not exclusively, made of aluminum, steel, nickel, bronze, brass, or silicon.

In embodiments, the Piezoelectric materials may be (a) Thin films of an AlN-ScN alloy, or AlN with dopants producing a similar effect like Sc doping in the form of ion pairs consisting of divalent ions like Ca and Mg combined with 4 to 5-valent ions like Ti, Mo, Nb, W, etc., wherein other piezoelectric thin films can be PZT, $LiNbO_3$, and further ferroelectric materials. Other equivalent materials are of course possible.

In embodiments, the Piezoelectric materials may be (b) smart crystal cut of suitable oriented piezoelectric crystals crystal joint to the metal sheet by metal or atomic layer bonding, wherein the crystal can be $LiNbO_3$, or any other crystalline, piezoelectric material from which smart cuts can be produced. Other equivalent materials are of course possible.

In embodiments, the substrate layer may be a low stiffness layer comprising a polymer layer or a fiber reinforced polymer layer of a PCB substrate. Other equivalent materials are of course possible.

In embodiments, the substrate layer may comprise a polished metal sheet conditioned for thin film deposition.

In embodiments, the vibration sensor may comprise a low-stiffness layer comprising a stiffness lower than the stiffness of the other layer and the housing.

In embodiments, the sensor may have the form of a plate and is tightly sandwiched between two parallel faces of the housing.

In embodiments, the electrode structure may comprise two parallel plate electrodes.

In embodiments, the low-stiffness layer may be configured to transform the distance changes between the two parallel faces of the housing into a stress uniformly acting onto the composite layer.

In embodiments, the electrode structure arranged on the piezoelectric layer may comprise interdigitated electrodes on a side opposite to the substrate layer. The piezoelectric layer may further comprise an insulating layer on the other side providing electrical insulation from the substrate. The low-stiffness layer may be arranged between the electrode surfaces and one of the parallel faces, the substrate layer may be fixed to the opposed parallel face. The low-stiffness layer may be configured to transform the shear deformation into a shear stress acting onto the piezoelectric layer with its interdigitated electrodes.

In embodiments, the piezoelectric layer may have the form of a bender forming a bridge within two fixation sites within the housing. The electrode structure may comprise two electrodes arranged on both sides of the piezoelectric layer in the parallel plate geometry.

In embodiments, the piezoelectric layer thickness to the substrate layer thickness ratio may be less than 1:10.

In embodiments, the vibration sensor may be used for vibration energy harvesting.

In embodiments, the invention concerns a process to polish metallic sheets for obtaining a surface with low roughness as required for the growth of high-quality AlN and AlScN and required for performing metal-metal bonds to smart crystal cuts wherein the process may apply chemical-mechanical polishing (CMP) and may make use of suitable thin film layers for smoothening the surface in addition, like $SiO_2$ thin films.

Figure 6:
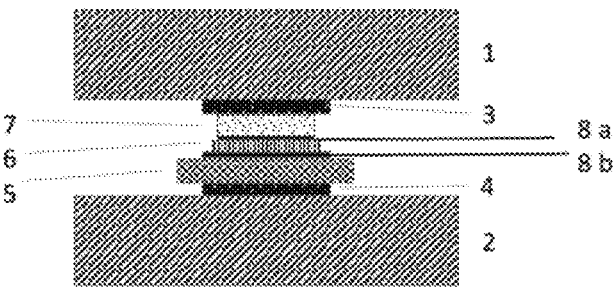
FIG. 6 illustrates a longitudinal vibration sensor according to one or more embodiments.

Longitudinal Vibration Sensor Without Inertial Mass (see FIG. 6)

In FIG. 6, the following references are used

1: first machine part 1
2: second machine part 2
3,4: vibration transmitters, hard material concentrating to area where deflection is homogeneous
5: base plate of sensor=substrate for growth of piezoelectric thin film stack (as e.g., CuBe sheet)
6: piezoelectric thin film stack with bottom electrode, piezoelectric thin film, and top electrode
7: strain-stress conversion material
8a: electrical wire to connect to top electrode
8b: electrical wire to connect to bottom electrode.

The primary effect of vibration is to induce vibrations of parts of a machine or of another device. This can mean that a part experiences an up and down translation with a time-varying amplitude, or it can mean that a part experiences a time-varying deformation (e.g., a time-varying bending). Locally (dimensions much smaller than the piece), this movement can be approximated by displacement in a given direction. One can find (or create) a surface for which the local displacement has a strong component perpendicular to the local surface of the piece. We consider the case where the two-machine parts experience different vibration amplitudes, resulting in a net vibration amplitude between the two pieces at the site of the sensor (see FIG. 6). The vibration manifests itself as a time-varying distance $\delta z(t)$ between machine pieces 1 and 2. The local amplitudes are concentrated into well-defined areas by vibration transmitters 3,4 consisting of relatively hard materials (e.g., made of steel for example) concentrating the area where deflection is homogeneous. Reference 5 illustrates a base plate of the sensor, e.g., a substrate for the growth of the piezoelectric thin film stack. Reference 6 illustrates a piezoelectric thin film stack with bottom electrode, piezoelectric thin film, and top electrode. The vibration cannot be transmitted to the piezoelectric stack directly. It would be too difficult to fit the sensor with zero tolerance between the two parts. What we need is an additional comparatively soft elastic material that withstands compression (layer 7 in FIG. 6 which is a strain-stress conversion material) when the sensor is inserted between the two machine parts. Within the sensor, this layer 7 is between a layer picking up the vibration 3 or 4 of one machine part, and the piezoelectric stack 6 with piezoelectric layer (thin film) and its parallel electrodes. The material of layer 7 performs a strain-stress transformation of the vibration (S for strain and $\sigma$ for stress) inside this softer layer 7.

Assuming that all other layers have much a larger stiffness (tensor c), the stress is related to the strain like:

$$\sigma_3 = c_{33}^{pm} S_3 \approx c_{33}^{pm} \frac{\delta z}{t_{pm}} \tag{6}$$

The strain-stress conversion material should have a low stiffness constant $$c_{33}^{pm},$$

as realized in certain polymer films (abr. pm) with a stiffness of 2-10 GPa. In this way, almost the complete strain is concentrated in this layer since all other layers have much larger stiffness constants (70 GPa and higher). The stress is, however, the same in all layers up to the fundamental thickness-mode resonance of the stack, which is by design much higher (MHz and higher) than the relevant resonances of the machine under test.

In an embodiment, the thickness ratio between the piezoelectric layer and the polymer layer may be less than 1:10.

Typically, the thickness ratio between the piezoelectric layer and the polymer layer may be about 1:100 (1 μm AlN, 100 μm passive elastic layer or polymer layer) or less, see example in table 1).

In FIG. 6, references 8a and 8b illustrate respectively an electrical wire to connect to a top electrode and an electrical wire to connect at the bottom electrode of the stack 6.

FIG. 6 illustrates a uniaxial vibration sensor picking up vibration amplitudes between two machine pieces.

According to equation 1 we can write down the charge density response of the piezoelectric thin film:

$$D_3 = d_{33,f}\sigma_3 + 2e_{31,f}s_{13}^{sub}\sigma_3 = (d_{33,f} + 2e_{31,f}s_{13}^{sub})\sigma_3 = d_{eff}\sigma_3) \tag{7}$$

Note that the compliance $$s_{13}^{sub}$$

is negative, as well as the transverse coefficient $e_{31,f}$. This means that the product of these two coefficients has the same sign as $d_{33,f}$.

Combining equations 5 and 6 we obtain:

$$D_3 = d_{eff} c_{33}^{pm} \frac{\delta z}{t_{pm}} \tag{8}$$

The charge Q on the electrode area A is obtained as:

$$Q = A d_{eff} c_{33}^{pm} \frac{\delta z}{t_{pm}} \tag{9}$$

The current I is the time derivative of the charge:

$$I = A d_{eff} c_{33}^{pm} \frac{d(\delta z)}{dt}{t_{pm}} = A d_{eff} c_{33}^{pm} \frac{1}{t_{pm}}\left(-i\omega\widehat{\delta z}e^{-i\omega t}\right). \tag{10}$$

Vibration frequencies specific for each machine type and size. Many times, they are in the range of few 100s Hz to several kHz. If we evaluate them with commercial accelerometers hooked onto the vibrating machine parts, we get as information the acceleration ($\alpha$ in units of g) measured at a certain frequency. As this is the only information one may have for the sensor design, it is useful to relate the sensor response to acceleration. In our example of a part vibrating against a static part:

$$\delta z = \widehat{\delta z}e^{-i\omega t}; \hat{a} = \omega^2 \widehat{\delta z} \tag{11}$$

$$I = A d_{eff} c_{33}^{pm} \frac{1}{t_{pm}}\left(-i\omega \frac{\hat{a}}{\omega^2}e^{-i\omega t}\right) = \frac{A d_{eff} c_{33}^{pm}}{\omega t_{pm}}\hat{a}e^{-i\omega t} \tag{12}$$

In order to calculate the generated voltage U and estimate the signal-to-noise ratio, we need also the capacitance value C.

$$C = \varepsilon_0 \varepsilon_r A/t_p \tag{13}$$

$$U = \frac{1}{i\omega C}I = \frac{d_{eff} c_{33}^{pm} t_p}{\varepsilon_0 \varepsilon_r \omega^2 t_{pm}}\hat{a}e^{-i(\omega t + \pi/2)}$$

TABLE 1

| Numerical values for A = 20 mm², $c_{33pm}$ = 2 GPa, $t_{pm}$ = 400 μm, $t_p$ = 2.0 μm (piezoelectric layer), $d_{eff}$ = $d_{33,f}$ = 15 C/m² (AlScN 42%), relative dielectric constant $\varepsilon_r$ = 20. | | | |
|---|---|---|---|
| Acceleration (g) | Frequency (Hz) | Current (μA) | Voltage (mV) |
| 5 | 1000 | 11.7 | 1050 |
| 5 | 10000 | 1.17 | 10.5 |
| 0.005 | 1000 | 0.017 | 1.05 |
| 0.005 | 10000 | 0.00117 | 0.0105 |

Finally, the intrinsic noise of the device must be considered, i.e., the Johnson-Nyquist noise. Capacitors also have a real part of the impedance, since they exhibit dielectric losses, usually defined as a loss tangent (tan$\delta$):

$$<v_n^2> = 4k_B T \int_{f1}^{f2} \text{Re}\left(1/(i\omega C(1 - i\cdot\tan\delta))\right)df \cong 4k_B T \frac{\tan\delta}{2\pi C}\int_{f1}^{f2}\frac{df}{f} = \tag{14}$$

-continued $$4k_B T \frac{\tan\delta}{2\pi C} \ln\left(\frac{f2}{f1}\right)$$

For the same parameters as in table 1, this noise voltage amounts to about 0.18 µV for a band ranging from 1 kHz to 10 kHz. It is about 60 times smaller than the response voltage at 5 mg/10 kHz. The noise from pick-up of electromagnetic parasitic signals is considered to be much more limiting than this intrinsic noise.

The size of the signal is significant and can be immediately exploited by typical electronic front-end designs. The polymer layer can be chosen to be softer and thicker to ease the practical implementation of the sensor, while still providing a significant signal output.

Piezoelectric Layer Material

The preferred piezoelectric thin film of the stack 6 for this application is $Al_{(1-x)}Sc_xN$, an alloy of AlN and ScN (discovered in 2009, see reference [11]), with a compositional parameter x between 0.15 and 0.45. The longitudinal coefficient $d_{33,f}$ can reach about 15 pm/V at 42% Sc, see reference [12], and the transverse coefficient $e_{31,f}$ reaches 2.7 C/m² at the same composition, see reference [13]. AlN and also AlScN can be conveniently grown in (0001) orientation (texture), i.e., in the direction of maximal piezoelectric response.

In contrast, another strong piezoelectric material 6 that is lead-free, $LiNbO_3$, does not grow easily in the ideal orientation of a large longitudinal piezoelectric response. It needs a special crystal cut, which seems to be more easily obtained by performing a smart cut process on a single crystal, see reference [14]. For this application a suitable process would be needed to be developed for assembling such a smart cut with a metal sheet. A possible process can be realized by metal-metal bonding.

Soft Transformer Material

The harder materials in the stack 6 include the piezoelectric layer of AlScN with a stiffness constant $c_{33}$ of 200 to 300 GPa, depending on composition. The aluminum (Al) sheets of the housing are at least as high as pure Al with an E-module of 69 GPa. Steel, nickel, or bronze substrates have stiffness constants in between the ones of Al and AlScN.

A convenient transformer material 7 would be PDMS, because it is a standard polymer material in microfabrication. Its elastic modulus ranges between 0.6 MPa and 4 MPa, and varies linearly with the amount of crosslinker concentration, see reference [15]. These values are, however, quite low, and the signal size would approach the thermal noise at the desired lowest detectable vibration.

In the correct range for our purpose is SU-8 photoresist. Its Young's modulus is reported to be in the range of 3 to 6 GPa.

Furthermore, a fiberglass-reinforced epoxy like FR-4, as used in printed circuit boards (PCB), might also be of interest. The fibers are woven and form a kind of 2-dimensional structure in the plane of the PCB plate. These materials have highly anisotropic elastic constants with modules (inverse compliance) of $E_{11}=E_{22}=22.4$ GPa, and $E_{33}=1.6$ GPa at room temperature, see reference [16]. The resulting stiffness $$c_{33}^{pm}$$

is derived as 3.8 GPa, which is well in the target range. This structure could also be helpful to increase lifetime since this polymer layer is more stable in lateral direction. There will be less cracks induced by the lateral tensile stress resulting from the Poisson effect when compressing the layer along its thickness.

The expected thickness mode resonance of the soft elastic materials—with for instance a thickness of 0.5 mm—is calculated to be in the range of a few MHz, thus much higher as the planned operation frequency of the sensor. Hence, the longitudinal sensor as presented in this invention would not amplify the response selectively at certain resonance frequencies as the sensors with seismic masses do. This makes the interpretation of the measurement results simpler, and without ambiguities.

Figure 7:
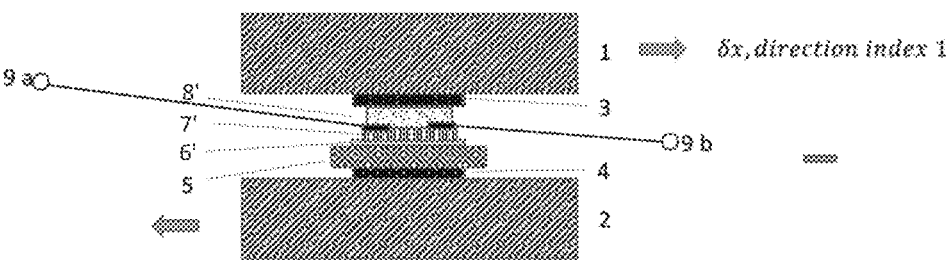
FIG. 7 illustrates a shear vibration sensor according to one or more embodiments.

Shear Vibration Sensor Without Inertial Mass (see FIG. 7)

In FIG. 7, the following references are used
1: first machine part 1 vibrating laterally with respect to second machine part
2: second machine part
3,4: vibration transmitters, hard material concentrating to area where deflection is homogeneous
5: base plate of sensor=substrate for growth of piezoelectric thin film stack (as e.g., CuBe sheet)
6': insulating layer, no bottom electrode for shear mode principle
7': piezoelectric thin film (coefficient $d_{15}$), split top electrode or interdigitated electrode
8': strain-stress conversion material: generation of shear stress $\sigma_{13}=\sigma_s$
Alternatively: solder for direct displacement transmission
9a: electrical wire to connect to top electrode stripe 1
9b: electrical wire to connect to top electrode stripe 2
A variant of the previous one is to apply the principle of strain-stress conversion to shear deformations. In the AlScN materials system we can count on a $d_{15}$ value of 2.5 pC/N. The electrode must be designed to detect an electric field in the plane of the piezoelectric thin film. This is realized by parallel stripe shaped electrodes. There must be at least two of them perpendicular to the vibration direction, or a multitude that are pairwise connected (interdigitated electrodes). Note that the film must be deposited on an insulating layer in order to obtain an electric field in the plane of the film, between the lateral electrodes on top of the film surface. For unknown vibration direction, one could use a second electrode system that is rotated by 90° with respect to the first one.

FIG. 7 illustrates the detection of shear distortions induced by machine parts 1, 2 vibrating laterally with respect to each other. The strain stress conversion can also be replaced by a direct displacement transmission by using for instance a thinner glue, or a metal soldering.

Figure 8:
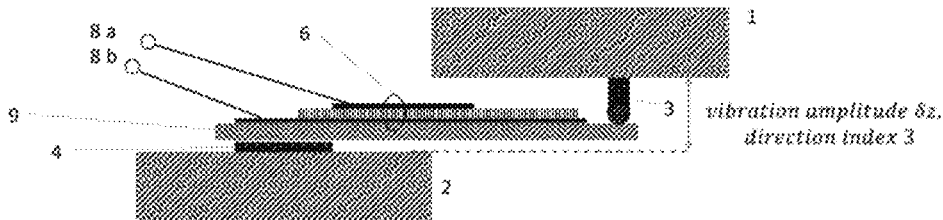
FIG. 8 illustrates a schematic cross-section of a transverse bending vibration sensor according to one or more embodiments.

Transverse Bending Vibration Sensor Without Seismic Mass (see FIG. 8)

In FIG. 8, the following references are used
1: first machine part 1

2: second machine part 2

3,4: vibration transmitters, hard material concentrating to area where deflection is homogeneous The device may be glued to piece 4 which is fixed to part 2.

6: piezoelectric thin film stack with bottom electrode, piezoelectric thin film, and top electrode 7: strain-stress conversion material 8a: electrical wire to connect to top electrode 8b: electrical wire to connect to bottom electrode.

9: elastic layer of beam, at the same time substrate for growing the piezoelectric stack.

A direct coupling to the vibration amplitude can also be achieved by an elastic cantilever (beam) 9 bridging two pieces vibrating against each other so as to have the major vibration amplitude perpendicular to the cantilever plane, i.e., along direction 3 in FIG. 8. The elastic structure 9 is the cantilever itself. It is prestressed to assure a good contact to item no. 3 (FIG. 8) transmitting the vibration to the quasi-free end of the cantilever.

FIG. 8: Schematic cross section of transverse bending vibration sensor with direct coupling to two parts vibrating against each other.

For the theory we can in relative good approximation reuse equation no 5, describing the $e_{31,f}$ measurement. A correction must be added if the thickness of the elastic layer approaches the one of the piezoelectric layer. This is treated in the literature. One can couple the vibration amplitude to the end of the cantilever, i.e., $Z_L = \delta z$ $$Q = \frac{3At_e(1-v)\left(L - \frac{\ell_1}{2}\right)e_{31,f}}{2L^3} \delta z \approx \frac{9wt_e(1-v)e_{31,f}}{16L} \delta z \tag{15}$$

The second part of the equation, A is replaced by w*L/2, and $\ell_1$ by L/2, assuming that the top electrode covers half of the length (where bending is stronger).

The figure of merit for the design is $w*t_e/L$. This means that the beams have to be wide, thick and short, i.e., quite rigid, for a good response. The following numbers were used for an evaluation:

L=5 mm, w=4 mm, $t_e$=0.3mm, $e_{31,f}$=2.5C/m², v=0.3. The currents are obtained as 615 nA and 0.615 nA for 5 g and 5 mg, respectively, at 1'000 Hz. This is about 25 times less than calculated for the longitudinal sensor at the same electrode area. This means that one has to design a multitude of cantilevers in order to match the signal size of the longitudinal effect. The Johnson-Nyquist noise stays the same as long as the area, the piezoelectric material, and its thickness are the same. This means that we are only a factor 5 above the noise level at 5 mg.

For this cantilever sensors, it could be of interest to use as elastic layer 9 a PCB structure (multilayer of glass fiber reinforced epoxy with copper layers). The adapted PCB could be a plate with the glass fibers running in only one direction (x-direction) in the plane, and not along both in-plane directions. Using cantilevers from such unidirectional reinforced epoxy plates with the long axis along x, one could then avoid the reduction of the response due to the Poisson ratio (see eqn 5).

Figure 9:
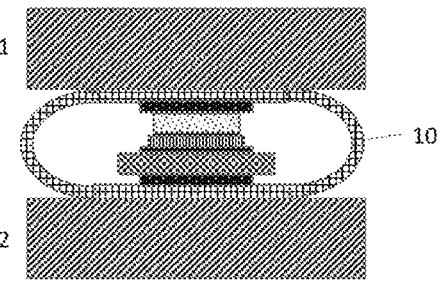
FIG. 9 illustrates a housing and a longitudinal vibration sensor according to one or more embodiments.

Functional Housing for the Vibration Sensors (FIG. 9)

The housing or package around the sensor plays a crucial role for enabling the displacement transfer and keeping the sensor intact. It must assure that the vibrating machine parts have a tight contact to the vibration transmitters of the sensor.

In addition, the surrounding of the sensor might emit electromagnetic waves, as for instance found in electromagnetic motors. For this reason, the housing must be like a Faraday cage, i.e., a full metal housing. The wires to and from the sensor must be shielded, i.e., coax cables must be used. The latter must be properly connected to the housing in order to avoid parasitic signal penetration or ground loops.

FIG. 9 illustrates a Metal housing 10 for the longitudinal vibration sensor of FIG. 6.

Figure 1:
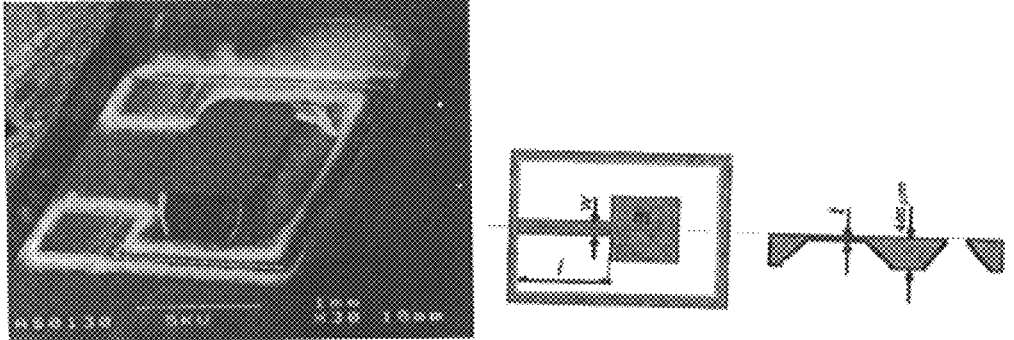
FIG. 1 illustrates a micromachined accelerometer according to prior art.
Figure 2:
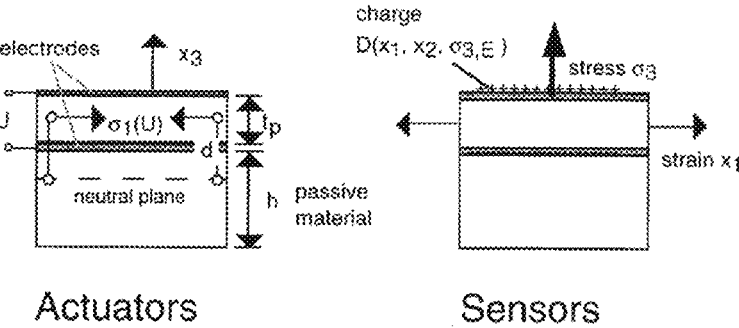
FIG. 2 illustrates a schematic side view for a piezoelectric heteromorph according to prior art.
Figure 3:
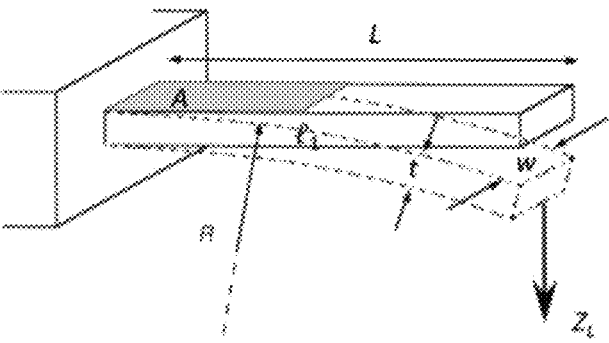
FIG. 3 illustrates a perspective view of a cantilever according to prior art.
Figure 4:
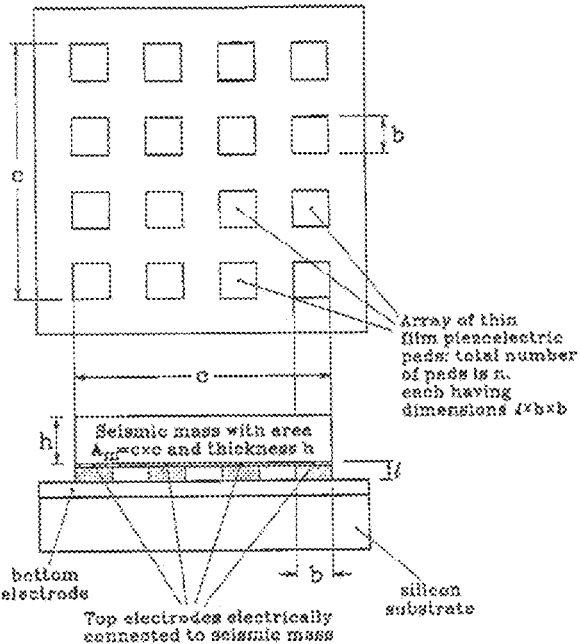
FIG. 4 illustrates top and side views of an accelerometer according to prior art.
Figure 5:
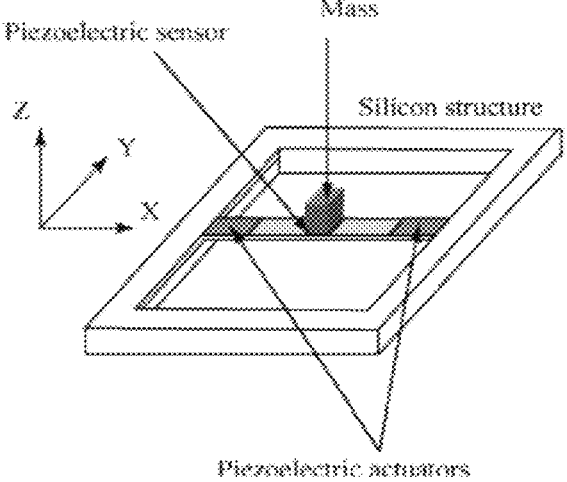
FIG. 5 illustrates a perspective view of an accelerometer according to prior art.

For the longitudinal sensor without seismic mass the housing wall is part of the stack transmitting the vibrations to the sensor. Inside the housing, there is a prestress set onto the strain-stress conversion layer (7 in FIG. 5). When mounting the machine, parts 1 and 2 must be adjusted for a defined force acting onto the sensor housing. It must be large enough to assure a tight mechanical connection, but not too large in order to avoid a destruction of the sensor. There are 2 possibilities to accommodate the correct pre-stress value:

1. The two machine parts are fixed together as is required for the functionality of the machine. The space foreseen for the sensor is precisely machined to a precision of +/− 10 μm for instance. The sensor is then made to accept a precompression between 5 and 25 μm for instance. The first value is for the lower tolerance (−10 μm), the higher value for the higher tolerance (+10 μm).

2. The correct prestress is achieved by additional screws, which have the only purpose to adjust the force onto the sensor after this one is placed. The two machine parts are fixed together by other screws.

The curved side wall of the housing has the function of a spring and prevents a counter force from the sidewall which could prevent a good prestressing of the sensor. In case of the shear sensor, it allows a lateral movement of the top side with respect to bottom side of the housing.

The housing between the two machine parts 1, 2 enables the transmission of vibrations between part 1 and part 2, directed against each other (z direction).

Figure 10:
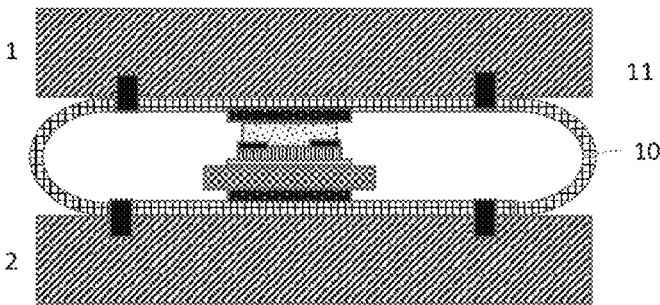
FIG. 10 illustrates a housing and a shear vibration sensor according to one or more embodiments.

FIG. 10 illustrates a Housing for the shear vibration sensor of FIG. 8. In principle, everything is the same as for the longitudinal sensor. However, the upper and lower housing walls have to follow tightly the movements of pieces 1 and 2, respectively. For this purpose, a lateral fixation like bolts 11 are introduced.

The housing 10 between the two machine parts 1 and 2 enables the transmission of vibrations between part 1 and part 2, directed against each other (z direction).

Fixation means such as bolts or screws 11 may fix the housing also laterally to pass vibrations to the housing walls, and from there to the vibration transmitters of the sensor.

Figure 11:
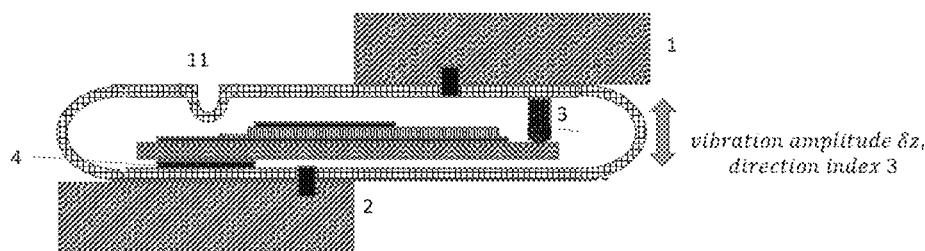
FIG. 11 illustrates a housing and a transverse bending sensor according to one or more embodiments.

FIG. 11 illustrates a housing for the (transverse) bender sensor of FIG. 9. Here it is important that the solution enables a bending of the housing. This is achieved in again with the curved side walls 10. In addition, one can add bellow 11 like structures to make the structure more flexible.

In FIG. 11, the following reference are used:

1: machine part 1

2: machine part 2

3, 4: vibration transmitter

11: Bellow-like structure of the housing in order to allow for bending of the housing or bellow type flexible parts of the housing.

A further possibility is given by the combination of longitudinal and transverse effect. In inorganic materials, longitudinal ($d_{33,f}$>0) and transverse coefficients ($e_{31,3}$<0) are of opposite sign. A compression of the film ($\sigma_3$<0) leads to a lateral elongation due to the Poisson effect, thus to $x_1$ and $x_2$>0. This means that the charge response from longitudinal and transvers effect have the same sign (negative). The charges add up when we use connected electrode systems. This was in fact discussed in reference [17] on the occasion of explaining potential measurement errors when the longitudinal piezoelectric effect is determined by a pressure applied perpendicular to the film plane, and assuming that only $\sigma_3$ is varying in equation 1. However, it was not mentioned that the two effects could be used for a sensor. A potential set-up is shown in FIG. 12.

A further variant could be to make the transverse sensor with a seismic mass. It would allow for increasing the high frequency response, or for specifically tracing a given frequency.

Figure 12:
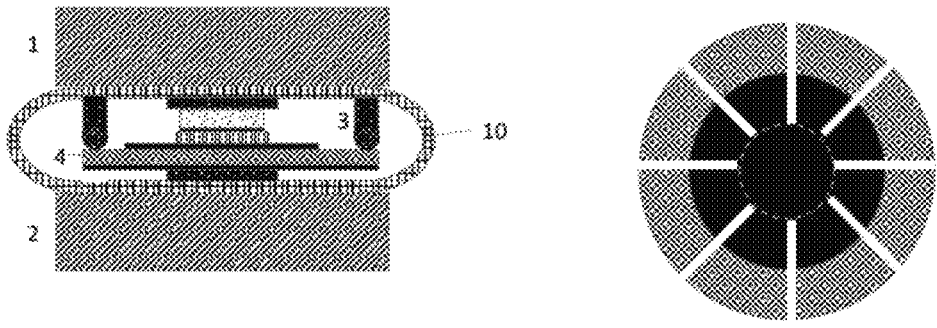
FIG. 12 illustrates an arrangement of sensor and housing for dual effect sensor according to one or more embodiments.

FIG. 12 illustrates an arrangement of sensor and housing for dual effect sensor, combining longitudinal and transverse effect.

On the left side of FIG. 12, the system comprises parts 1 and 2 of the machine, a vibration transmitter in the shape of a ring 3 and a piezoelectric stack 4 (piezo—layer with electrodes). The right side of FIG. 12 is a top view of a piezoelectric stack for sensor combining longitudinal (in the center) and transverse effect. The disk is split up into segments to make it softer.

Fabrication of the Sensor

Figure 13:
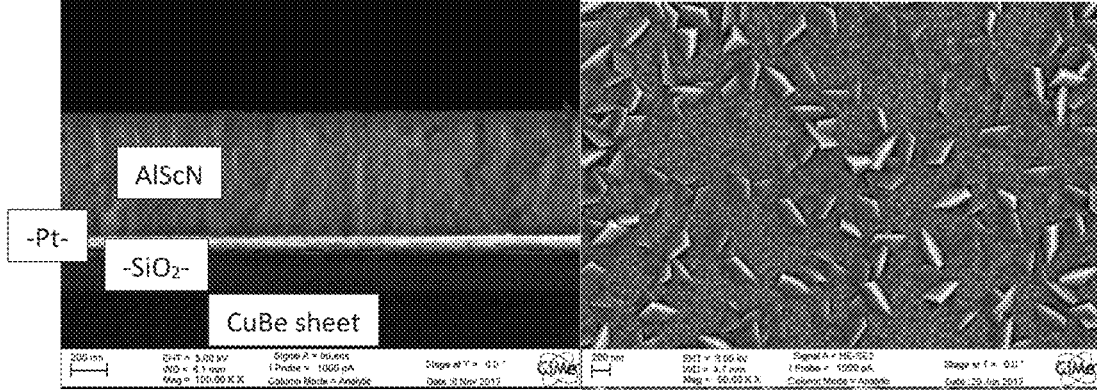
FIG. 13 illustrates a cross-section and top views of AlScN deposition onto polished CuBe bronze foils according to one or more embodiments.

The sensor might be realized by different techniques. A particular one the inventors already master is based on the deposition of AlScN layers onto polished metal sheets made of Beryllium bronze. We achieved a good $e_{31,f}$ of −2.4 C/m$^2$ with 37% Sc on the Al sites. FIG. 13 illustrates a Cross section and top views of AlScN deposition onto polished CuBe bronze foils (300 µm thick)

The process was based on commercial BeCu Bronze. Such a sheet was lapped and polished, however, not free of surface irregularities (small holes and trenches). For an improved surface quality, the foil was additionally polished by chemical mechanical polishing (CMP). A SiO$_2$ thin film was deposited by sputtering, further increasing the surface quality, and isolating the piezoelectric stack electrically from the CuBe sheet. The latter point is also of importance for the realization of shear mode detection. Subsequently, a Pt/Ti bottom electrode was deposited by sputtering. The AlScN thin film was grown by pulsed DC, reactive magnetron sputtering from a metallic AlSc alloy target, a process first described in reference [18].

Figure 14:
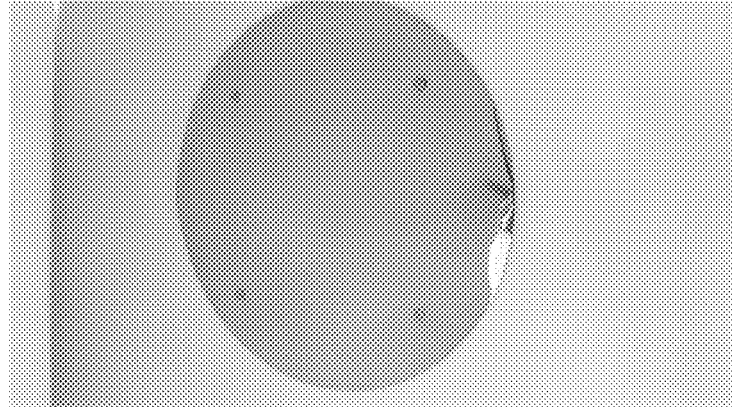
FIG. 14 illustrates a top view of a CuBe bronze sheet according to one or more embodiments.

FIG. 14 illustrates a top view of CuBe bronze sheet that was polished by CMP and subsequently coated with SiO$_2$, Pt and AlScN.

Figure 15:
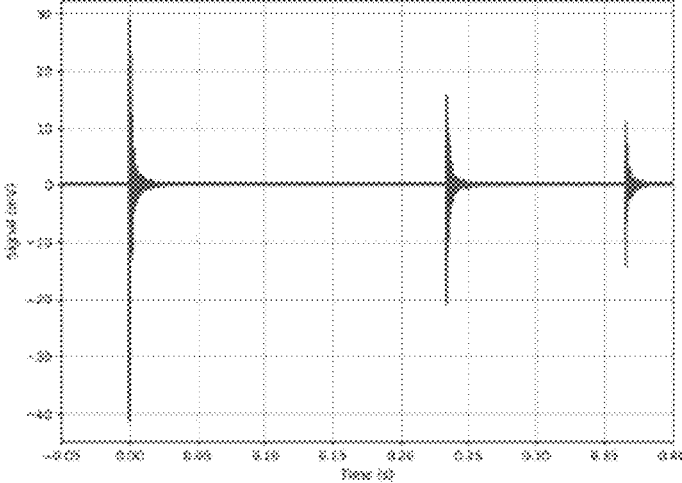
FIG. 15 is a graph illustrating a basic test of a longitudinal device.

FIG. 15 illustrates results of a basic test of longitudinal device. A 55 mg heavy ball makes a fall of 20 cm before hitting the sensor. The first impact is followed by 2 rebounds. The signal is pre-amplified with a gain of one and recorded by an oscilloscope.

Examples of Working Principles and Embodiments Taking the Above Description into Consideration In a first working principle, the vibration force sensor has the form of a plate and is tightly sandwiched between two parallel faces of the housing, see FIGS. 6 and 9.

The piezoelectric film is equipped with two parallel plate electrodes, and the composite includes a low-stiffness layer comprising a much lower stiffness than the stiffness of the other layers including housing, transforming the distance changes between the two parallel faces of the housing into a stress uniformly acting onto the complete composite stack.

The piezoelectric effect is the longitudinal one (clamped d33) as obtained in films with polar direction perpendicular to the film plane.

The generated charges and voltages at the parallel plate electrodes provide the electrical quantities for the sensor output signal.

In a second working principle, the vibration force sensor has the form of a plate and is tightly sandwiched between two parallel faces of the housing, see FIGS. 7 and 10.

The piezoelectric film is equipped with interdigitated electrodes on the side opposite to substrate, and an insulating layer on the other side providing electrical insulation from the substrate.

The low-stiffness layer comprising a much lower stiffness than the stiffness of the other layers including housing is situated between the electrode surface and one of the parallel faces.

The substrate side is fixed to the other parallel face. When the parallel faces are moving in antiparallel directions, thus performing a shear deformation, the low-stiffness layer transforms the shear deformation into a shear stress acting onto the piezoelectric layer with its interdigitated electrodes.

The piezoelectric effect is the shear one (d15) as obtained in films with polar direction perpendicular to the film plane and generated electric field in the plane.

The generated charges at the interdigitated electrodes provide the current for the sensor output signal.

In a third working principle, the piezoelectric composite structure has the form of a bender forming a bridge between two fixation sites within the housing, see FIGS. 8 and 11.

As the housing is mounted between two machine parts, it is deformed (stretched, twisted), thus changing the distance between the two fixation sites, which leads to stretching compression or bending of the bender laminate.

The electrodes are mounted on both sides of the piezoelectric layer in the parallel plate geometry.

Using films polarized perpendicular to the layer plane, the transverse piezoelectric effect generates charges and a voltage difference, both of these can be used to provide a signal output.

In embodiments, the invention concerns a stacked piezoelectric thin film vibration sensor, whereby the lateral extension amounts to a least 10 times the total thickness, embedded in a functional, metallic housing transmitting longitudinal vibration deformations in parallel to the thickness direction in a frequency range of 5 Hz to 30 kHz comprising:

a piezoelectric thin film two plane electrodes on both faces of the latter a metallic substrate on which the piezoelectric thin film is deposited a soft elastic layer having a stiffness of less than 10% of those of the other layers in the stack and the housing (casing? enclosure?) wall, and having a thickness that is at least 10 times larger than the piezoelectric film thickness Stress focus layers at both ends, made of a hard material, that have the area of the electrodes, and can be part of the stack, or of the housing.

A housing fitting the top and bottom side of the stack, leaving no spacing between the various layers in the stack, and between housing and stack, and exhibiting flexible sidewalls for allowing unconstraint motion in thickness direction of the walls adjacent to the stress focus layers The housing provides a pre-stress of the stack (clamping)

The housing is shielding against electromagnetic radiation

Electrical connections to both electrodes leaving the housing through shielded holes wherein the complete device is optimized to fit between two machine pieces vibrating against each other.

In embodiments, the invention concerns a stacked piezoelectric thin film vibration sensor, whereby the lateral extension amounts to a least 10 times the total thickness, embedded in a functional, metallic housing transmitting shear vibration deformations in a frequency range of 5 Hz to 30 kHz comprising:

a piezoelectric thin film an interdigitated electrode system on one face of the latter a metallic substrate on which the piezoelectric thin film is deposited an insulating layer on the substrate isolating piezoelectric film and substrate a soft elastic layer having a stiffness of less than 10% of those of the other layers in the stack and the housing (casing? enclosure?) wall, and having a thickness that is at least 10 times larger than the piezoelectric film thickness Stress focus layers at both ends, made of a hard material, that have the area of the electrodes, and can be part of the stack, or of the housing.

A housing fitting (clamping) the top and bottom side of the stack, leaving no spacing between the various layers in the stack, and between housing and stack, and exhibiting flexible sidewalls for allowing unconstraint motion in thickness and lateral direction of the walls adjacent to the stress focus layers wherein the housing exhibits anchors to pick up the shear motion wherein the housing provides a pre-stress of the stack (clamping)

wherein the housing is shielding against electromagnetic radiation

Electrical connections to both electrodes leaving the housing through shielded holes wherein the complete device is optimized to fit between two machine pieces vibrating laterally in opposite directions.

In embodiments, the invention concerns a device with a central part working in the longitudinal mode according to the above, and an external part working in the bending mode according to the above, whereby the external part is not clamped but free to move and bent by a fixation to one of the housing walls (top or down).

In embodiments, the sensor is preferentially based on a piezoelectric layer bonded or deposited onto a metallic, robust metal sheet with a thickness of typically—but not limited to—10 to 500 μm and wherein the metal sheet is typically, but not exclusively, made of aluminum, steel, nickel, bronze, or brass.

In embodiments, the Piezoelectric materials are: (a) Thin films of an AIN-ScN alloy, or AIN with dopants producing a similar effect like Sc doping in the form of ion pairs consisting of divalent ions like Ca and Mg combined with 4 to 5 -valent ions like Ti, Mo, Nb, W, etc., wherein other piezoelectric thin films can be PZT, $LiNbO_3$, and further ferroelectric materials. (b) smart crystal cut of suitable oriented piezoelectric crystals crystal joint to the metal sheet by metal or atomic layer bonding, wherein the crystal can be $LiNbO_3$, or any other crystalline, piezoelectric material from which smart cuts can be produced.

In embodiments, the soft elastic layer 7 being a simple polymer as defined herein or a fiber reinforced polymer like used for printed circuits boards.

In embodiments, the device may be used for vibration energy harvesting

In embodiments, the invention concerns a process to polish metallic sheets for obtaining a surface with low roughness as required for the growth of high-quality AIN and AlScN and required for performing metal-metal bonds to smart crystal cuts. The process applies chemical-mechanical polishing (CMP) and makes use of suitable thin film layers for smoothening the surface in addition, like $SiO_2$ thin films.

The present description is neither intended nor should it be construed as being representative of the full extent and scope of the present invention. The present invention is set forth in various levels of detail herein as well as in the attached drawings and in the detailed description of the invention and no limitation as to the scope of the present invention is intended by either the inclusion or non inclusion of elements, components, etc. Additional aspects of the present invention have become more readily apparent from the detailed description, particularly when taken together with the drawings.

Moreover, exemplary embodiments have been described to provide an overall understanding of the principles of the structure, function, manufacture, and use of the systems and methods disclosed herein. One or more examples of these embodiments are illustrated in the accompanying drawings. Those skilled in the art will understand that the systems and methods specifically described herein and illustrated in the accompanying drawings are non-limiting exemplary embodiments and that the scope of the present invention is defined not solely by the claims. The features illustrated or described in connection with an exemplary embodiment may be combined with the features of other embodiments. Also, equivalent structures and/or materials may be used. Such modifications and variations are intended to be included within the scope of the present invention. Moreover, while this invention has been described in conjunction with a number of embodiments, it is evident that many alternatives, modifications and variations would be or are apparent to those of ordinary skill in the applicable art. Accordingly, it is intended to embrace all such alternatives, modifications, equivalents and variations that are within the spirit and scope of this invention Citations/references

[1] J. W. Waanders, *Piezoelectric Ceramics, Philips Components*. Philips, 1991.

[2] P. Muralt, "Ferroelectric thin films for microsensors and actuators: a review," *Micromech.Microeng.*, vol. 10, no. 2, pp. 136-146, 2000.

[3] D. L. Polla, "Integrated Ferroelectric Microelectromechanical Systems," in *Science and Technolog of Electroceramic Thin Films*, Vita del Mare, 1995, pp. 399-412.

[4] J. Baborowski, S. Hediger, P. Muralt, and Ch. Wüthrich, "Micromachined fabrication and characterization of accelerometers based on PZT thin films," *Ferroelectrics*, vol. 224, pp. 283-290, 1999.

[5] P. Muralt, "Piezoelectric thin films for MEMS," *Integr. Ferroelectr.*, vol. 17, pp. 297-307, 1997.

[6] Q. Meng, M. Mehregany, and K. Deng, "Modeling of the electromechanical performance of piezoelectric laminated microactuators," *J. Micromech.Microeng.*, vol. 3,pp. 18-23, 1993.

[7] J. G. Smits and W. -S. Choi, "The Constituent equation of piezoelectric heterogeneous bimorphs," *IEEE Trans UFFC*, vol. 38, pp. 256-270,1991.

[8] M. -A. Dubois and P. Muralt, "Measurement of the effective transverse piezoelectric coefficient e31, f of AIN and PZT thin films," *Sens. Actuators A*, vol. 77, pp. 106-112,1999.

[9] Y. Nemirovsky, A. Nemirovsky, P. Muralt, and N. Setter, "Design of a novel thin film piezoelectric accelerometer," *Sens. Actuators A*, vol. 56, pp. 239-249, 1996.

[10] Y. Meyer, T. Verdot, M. Collet, J. Baborowski, and P. Muralt, "Active isolation of electronic micro-components with piezoelectrically transduced silicon MEMS devices," *Smart MaterStruct*, vol. 16, pp. 128-134, 2007.

[11] M. Akiyama, T. Kamohara, K. Kano, A. Teshigahara, Y. Takeuchi, and N. Kawahara, "Enhancement of piezoelectric response in scandium aluminum nitride alloy thin films perpared by dual reactive cosputtering," *Adv.Mat.*, vol. 21, pp. 593-596,2009.

[12] S. Mertin et al., "Enhanced piezoelectric properties of c-axis textured aluminium scandium nitride thin films with high scandium content: influence of intrinsic stress and sputtering parameter," Washington, 2017, vol. 978-1-5386-3383-0/17.

[13] S. Mertin et al., "Piezoelectric and structural properties of c-axis textured aluminium scandium nitride thin films up to high scandium content," *Surf Coat Technol*, vol. 343, pp. 2-6, 2018, doi: doi.org/10.1016/j.surfcoat.2018.01.046.

[14] J. -S. Moulet, M. Pijolat, S. Ballandras, and et.al., "J. -. Moulet et al., 'High piezoelectric properties in LiNbO3 transferred layer by the Smart Cut™ technology for ultra wide band BAW filter applications,' 2008 IEEE International Electron Devices Meeting, San Francisco, CA, 2008, pp. 1-4, doi: 10.1109/IEDM.2008.4796785.," presented at the 2008 IEEE International Electron Devices Meeting, San Francisco, 2008.

[14] Z. Wang, A. A. Volinsky, and N. D. Gallant, "Cross-linking Effect on Polydimethylsiloxane Elastic Modulus Measured by Custom-Built Compression Instrument,"*JApplPolymer Sci*, vol. 131, p. 41050, 2014.

[16] L. A. A. Beex, "Warpage of Printed Circuit Boards," Bachelor thesis, Technical University of Eindhoven, Eindhoven, 2005.

[17] A. Barzegar, D. Damjanovic, N. Ledermann, and P. Muralt, "Piezoelectric response of thin film determined by charge integration technique: Substrate bdending effects," *J.AppLPhys.*, vol. 93, pp. 4756-60, 2003.

[18] M. -A. Dubois and P. Muralt, "Properties of AIN thin films for piezoelectric transducers and microwave filter applications,"*AppLPhys.Lett.*, vol. 74, pp. 3032-3034, 1999.

The invention claimed is:

1. A vibration sensor comprising:
a layered composite comprising
    at least one substrate layer,
    at least one piezoelectric layer comprising
        a piezoelectric thin film or at least one cut thin layer of piezoelectric materials, and
        an electrode structure, and at least one low-stiffness layer of a stiffness less than or equal to 10 GPa,
wherein the vibration sensor is configured to be integrated into a functional, metallic housing and to receive vibration deformations from the functional, metallic housing in a frequency range,
wherein the at least one low-stiffness layer is configured to transform the vibration deformations into a mechanical stress that the vibration sensor converts to electrical energy,
wherein the mechanical stress comprises any one of: thickness changes, lateral strain changes, and shear strain changes.

2. The vibration sensor of claim 1, wherein the housing and connecting wires are configured to shield against parasitic electromagnetic signals.

3. The vibration sensor of claim 1, wherein the frequency range is 10 Hz to 20 kHz.

4. The vibration sensor of claim 1, wherein the frequency range is 100 Hz to 20 kHz.

5. The vibration sensor of claim 1, wherein the electrode structure comprises parallel electrodes including one electrode on an upper side of the at least one piezoelectric layer and one electrode at a bottom side of the at least one piezoelectric layer, and upon receiving the vibration deformations, charges or the voltage is gathered at the parallel electrodes.

6. The vibration sensor of claim 5, wherein the vibration sensor has a seismic mass configured to transform acceleration into a bending motion of a cantilever.

7. The vibration sensor of claim 1, wherein the at least one piezoelectric layer is bonded or deposited onto a metal sheet with a thickness of 10 to 500 μm, and
    wherein the metal sheet is made of one of aluminum, steel, nickel, bronze, brass, and silicon.

8. The vibration sensor of claim 1, wherein the at least one piezoelectric layer comprises at least one of an AIN-ScN alloy film, a AIN film with dopants, PZT, LiNbO3, and oriented piezoelectric crystals joined to a metal sheet by metal or atomic layer bonding, the crystals being one of LiNbO3, and a crystalline, piezoelectric material.

9. The vibration sensor of claim 1, wherein the at least one substrate layer is a low stiffness layer comprising a polymer layer or a fiber reinforced polymer layer of a PCB substrate.

10. The vibration sensor of claim 1, wherein the at least one substrate layer comprises a polished metal sheet conditioned for thin film deposition.

11. The vibration sensor of claim 1, wherein the at least one low-stiffness layer contains polymers.

12. The vibration sensor of claim 1, wherein the vibration sensor has the form of a plate and is configured to be sandwiched between two parallel faces of the housing.

13. The vibration sensor of claim 12, wherein the electrode structure comprises two parallel plate electrodes, the at least one low-stiffness layer being configured to transform distance changes between the two parallel faces of the housing into a stress uniformly acting onto the composite layer.

14. The vibration sensor of claim 12, wherein the electrode structure is disposed on the at least one piezoelectric layer and comprises interdigitated electrodes on a side opposite to the substrate layer, the piezoelectric layer comprising an insulating layer on the other side providing electrical insulation from the substrate, the at least one low-stiffness layer being disposed between the electrode surfaces and one of the parallel faces, the substrate layer being fixed to the opposed parallel face, the low-stiffness layer being configured to transform shear deformation into a shear stress acting onto the piezoelectric layer with its interdigitated electrodes.

15. The vibration sensor of claim 1, wherein the at least one piezoelectric layer is a bender forming a bridge within two fixation sites within the housing, the electrode structure comprising two electrodes disposed on both sides of the piezoelectric layer.

16. The vibration sensor of claim 1, wherein the piezoelectric layer thickness to the substrate layer thickness ratio is less than 1:10.

17. The vibration sensor of claim 1, wherein the vibration sensor is configured to harvest vibrational energy.

18. The vibration sensor of claim 1, wherein the electrode structure is disposed on the at least one piezoelectric layer and comprises a plurality of interdigitated electrodes, the at least one piezoelectric layer is disposed on an insulating substrate, and the electrodes are only on one side of the insulating substrate.

19. The vibration sensor of claim 1, further comprising a beam configured to connect two sites of the housing and configured to be deformed when the two sites of the housing move against each other, wherein the electrode structure comprises parallel top and bottom electrodes, and wherein the at least one piezoelectric layer is attached to the beam and generates charges and voltage between the parallel top and bottom electrodes.

* * * * *